(12) United States Patent
Abe et al.

(10) Patent No.: US 12,033,836 B2
(45) Date of Patent: Jul. 9, 2024

(54) NITRIDING APPARATUS AND NITRIDING METHOD

(71) Applicant: KOBE STEEL, LTD., Hyogo (JP)

(72) Inventors: Maiko Abe, Takasago (JP); Koichiro Akari, Nagoya (JP)

(73) Assignee: Kobe Steel, Ltd., Hyogo (JP)

( * ) Notice: Subject to any disclaimer, the term of this patent is extended or adjusted under 35 U.S.C. 154(b) by 648 days.

(21) Appl. No.: 17/278,167

(22) PCT Filed: Sep. 26, 2019

(86) PCT No.: PCT/JP2019/037864
§ 371 (c)(1),
(2) Date: Mar. 19, 2021

(87) PCT Pub. No.: WO2020/080058
PCT Pub. Date: Apr. 23, 2020

(65) Prior Publication Data
US 2021/0351015 A1 Nov. 11, 2021

(30) Foreign Application Priority Data
Oct. 15, 2018 (JP) ................. 2018-194195

(51) Int. Cl.
| | | |
|---|---|---|
| *C23C 8/24* | (2006.01) | |
| *C23C 8/36* | (2006.01) | |
| *G01K 7/04* | (2006.01) | |
| *H01J 37/32* | (2006.01) | |

(52) U.S. Cl.
CPC .......... *H01J 37/32522* (2013.01); *C23C 8/24* (2013.01); *C23C 8/36* (2013.01); *G01K 7/04* (2013.01); *H01J 37/32018* (2013.01); *H01J 37/3244* (2013.01); *H01J 37/32715* (2013.01); *H01J 2237/2001* (2013.01); *H01J 2237/20214* (2013.01); *H01J 2237/3387* (2013.01)

(58) Field of Classification Search
CPC ................ C23C 8/24; C23C 8/36; C23C 8/38
See application file for complete search history.

(56) References Cited

FOREIGN PATENT DOCUMENTS

| | | |
|---|---|---|
| JP | S49-001441 A | 1/1974 |
| JP | S51-054843 A | 5/1976 |
| JP | S56-093873 A | 7/1981 |
| JP | 2931173 B2 | 8/1999 |
| JP | 2006-249508 A | 9/2006 |
| JP | 4042962 B2 | 2/2008 |
| JP | 2008-255405 A | 10/2008 |
| JP | 2009-091615 A | 4/2009 |
| JP | 2016-196696 A | 11/2016 |

OTHER PUBLICATIONS

English Abstract and English Machine Translation of Kimura (JP 2008-255405) (Oct. 23, 2008).*
The extended European search report issued by the European Patent Office on Dec. 13, 2021, which corresponds to European Patent Application No. 19872612.7-1103 and is related to U.S. Appl. No. 17/278,167.
Notification Concerning Transmittal of International Preliminary Report on Patentability and Translation of Written Opinion of the International Searching Authority; PCT/JP2019/037864; mailed on Apr. 29, 2021.

* cited by examiner

*Primary Examiner* — Jessee R Roe
(74) *Attorney, Agent, or Firm* — Studebaker & Brackett PC

(57) ABSTRACT

Provided are a nitriding apparatus and a method of nitriding, which are capable of suppressing generation of a compound layer by accurately measuring temperature of an object to be treated by nitriding. A nitriding apparatus includes a chamber, a gas supplying unit, a support, a plasma source, a heater, a thermocouple wire including a temperature measuring section, an accommodating member, a power supply for an object to be treated, and a treatment condition control unit. The accommodating member internally accommodates the thermocouple wire to cover the temperature measuring section, while being insulated from the thermocouple wire. The power supply for an object to be treated applies a predetermined voltage to an object to be treated and the housing member so that the object to be treated and the accommodating member are set to an identical potential on the negative side.

15 Claims, 6 Drawing Sheets

FIG.6
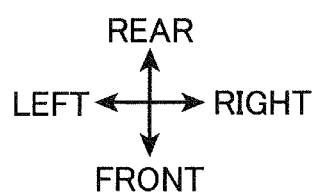
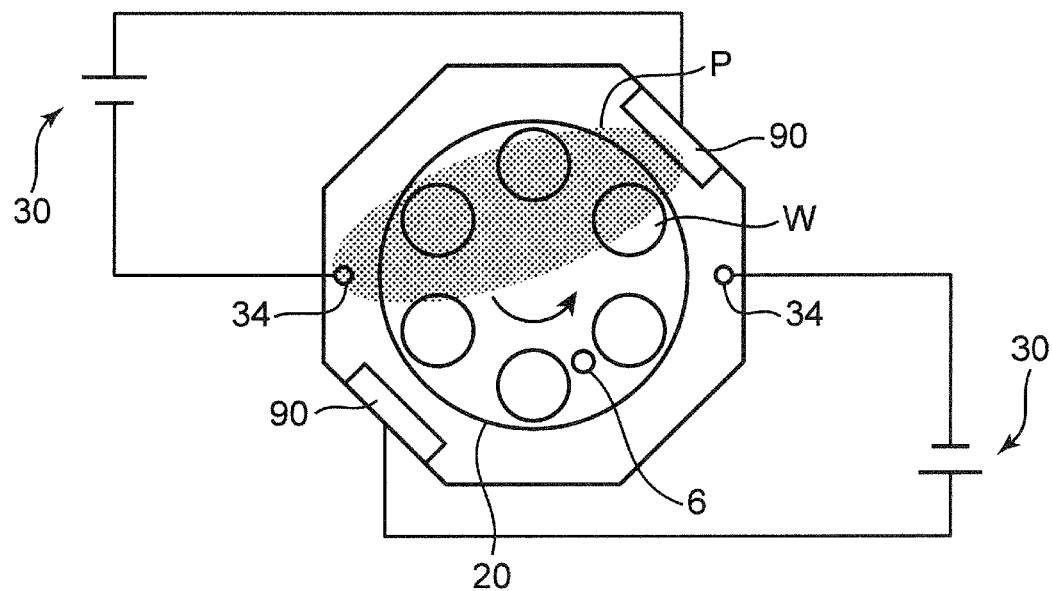

NITRIDING APPARATUS AND NITRIDING METHOD

TECHNICAL FIELD

The present invention relates to a nitriding apparatus and a method of nitriding.

BACKGROUND ART

A nitriding apparatus and a method of nitriding using the same are conventionally known in which a metal surface is subjected to ion nitriding to form a metal nitride layer on the surface, and thus improving wear resistance and corrosion resistance of the metal surface. Patent Literature 1 discloses a method of nitriding as described above in which while a metal member as an object to be treated is maintained at a temperature of 300° C. to 650° C. by a heating mechanism in a vacuum chamber, glow discharge is applied to a surface of the metal member at a current density of 0.001 mA/cm$^2$ to 2.9 mA/cm$^2$ using ammonia gas and hydrogen gas to ion nitride the surface of the metal member. While Patent Literature 1 does not disclose a temperature measurement mechanism of the metal member, nitriding as described above has a problem in that excessive increase in temperature of the metal member may cause a compound layer to be formed on the surface of the metal member. When such a compound layer is generated, a step of polishing the compound layer after the nitriding is required. This deteriorates treatment efficiency for the metal member. Thus, accurate measurement of temperature of the metal member in the vacuum chamber is desired.

Patent Literature 2 discloses a technique for applying a deposition process on a surface of a metal member by physical vapor deposition or chemical vapor deposition in a vacuum chamber. The technique uses a radiation thermometer to measure temperature of the metal member in the vacuum chamber. The radiation thermometer is disposed outside the vacuum chamber and measures the temperature of the metal member through an observation window provided in the vacuum chamber. Such a radiation thermometer measures temperature of a metal member by measuring intensity of infrared rays or visible light emitted from the metal member.

CITATION LIST

Patent Literature

Patent Literature 1: JP 2931173 B2
Patent Literature 2: JP 4042962 B2

When temperature of a metal member is measured in a conventional nitriding apparatus as described in Patent Literature 1 using a radiation thermometer as described in Patent Literature 2, the temperature of the metal member is less likely to be measured with high accuracy. This results in causing a problem in that a compound layer may be formed on the surface of the metal member. In general, a radiation thermometer is likely to be affected by a temperature change of the radiation thermometer itself during measurement, and a measured temperature is likely to have an error due to a fluctuation of a focal position of a metal member. This causes difficulty in measuring temperature of a metal member to be subjected to nitriding using a radiation thermometer.

SUMMARY OF INVENTION

It is an object of the present invention to provide a nitriding apparatus and a method of nitriding, which are capable of suppressing generation of a compound layer by accurately measuring temperature of an object to be treated by nitriding.

The present invention provides a nitriding apparatus, the nitriding apparatus including: a chamber made of metal having an internal space; a gas supplying unit communicating with the internal space to supply a gas containing at least nitrogen to the internal space; a support disposed in the internal space to support at least one object to be treated that is made of metal; a plasma source that generates plasma in the internal space, and has a cathode disposed in the internal space and an anode disposed facing the cathode to generate nitrogen ions from at least the nitrogen; at least one heater disposed in the internal space to heat the object to be treated; at least one thermocouple wire that is disposed in the internal space, being adjacent to the at least one object to be treated and having a temperature measuring section to output a signal corresponding to temperature detected by the temperature measuring section; at least one accommodating member made of metal that internally accommodates the at least one thermocouple wire to cover the temperature measuring section in a state insulated from the at least one thermocouple wire; a power supply for an object to be treated that applies predetermined voltage to the at least one object to be treated and the at least one accommodating member to set the at least one object to be treated and the at least one accommodating member to an identical potential on a negative side; and a treatment condition control unit that controls a heating value of the at least one heater based on the signal output from the at least one thermocouple wire.

The present invention also provides a method of nitriding, the method of nitriding including the steps of: disposing a support in an internal space of a chamber and supporting an object to be treated that is made of metal with the support; disposing a thermocouple wire in the internal space to be adjacent to the object to be treated, the thermocouple wire including a temperature measuring section and outputting a signal corresponding to temperature detected by the temperature measuring section; disposing an accommodating member made of metal and insulated from the thermocouple wire in the internal space, and accommodating the thermocouple wire in the accommodating member to cover the temperature measuring section; supplying a gas containing at least nitrogen into the internal space of the chamber under vacuum; heating the object to be treated with a heater disposed in the internal space; generating plasma in the internal space using a plasma source that is disposed in the internal space and has a cathode and an anode disposed facing the cathode to generate nitrogen ions from at least the nitrogen; and applying nitriding to the object to be treated by applying predetermined voltage to the object to be treated and the accommodating member to set the object to be treated and the accommodating member to an identical potential on a negative side, and by colliding the nitrogen ions with the object to be treated while controlling a heating value of the heater based on the signal output from the thermocouple wire.

BRIEF DESCRIPTION OF DRAWINGS

FIG. 6 is a plan view of a nitriding apparatus according to a second modified embodiment of the present invention.

DESCRIPTION OF EMBODIMENTS

Figure 1:
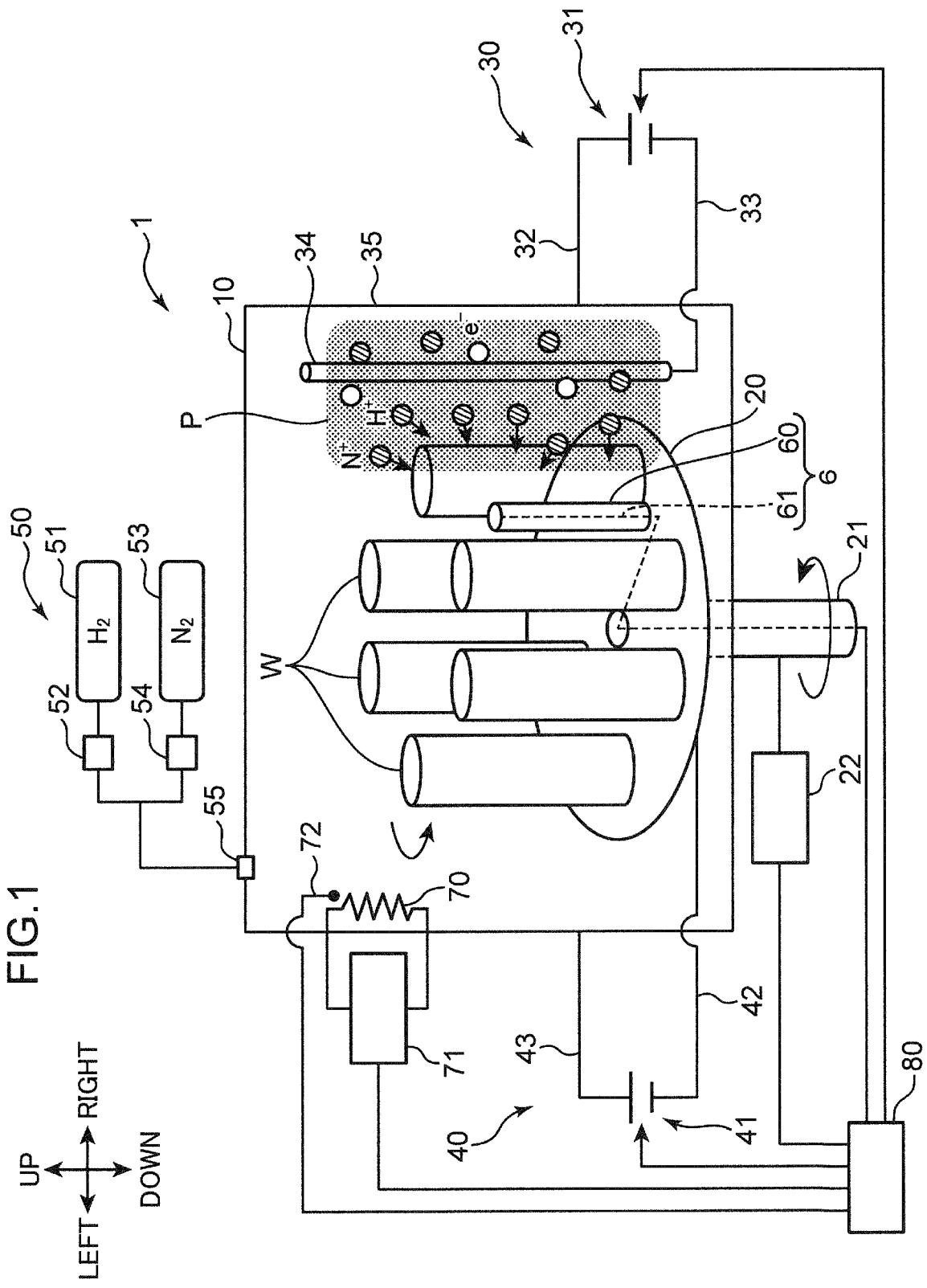
FIG. 1 is a schematic perspective view of a nitriding apparatus according to an embodiment of the present invention.
Figure 2:
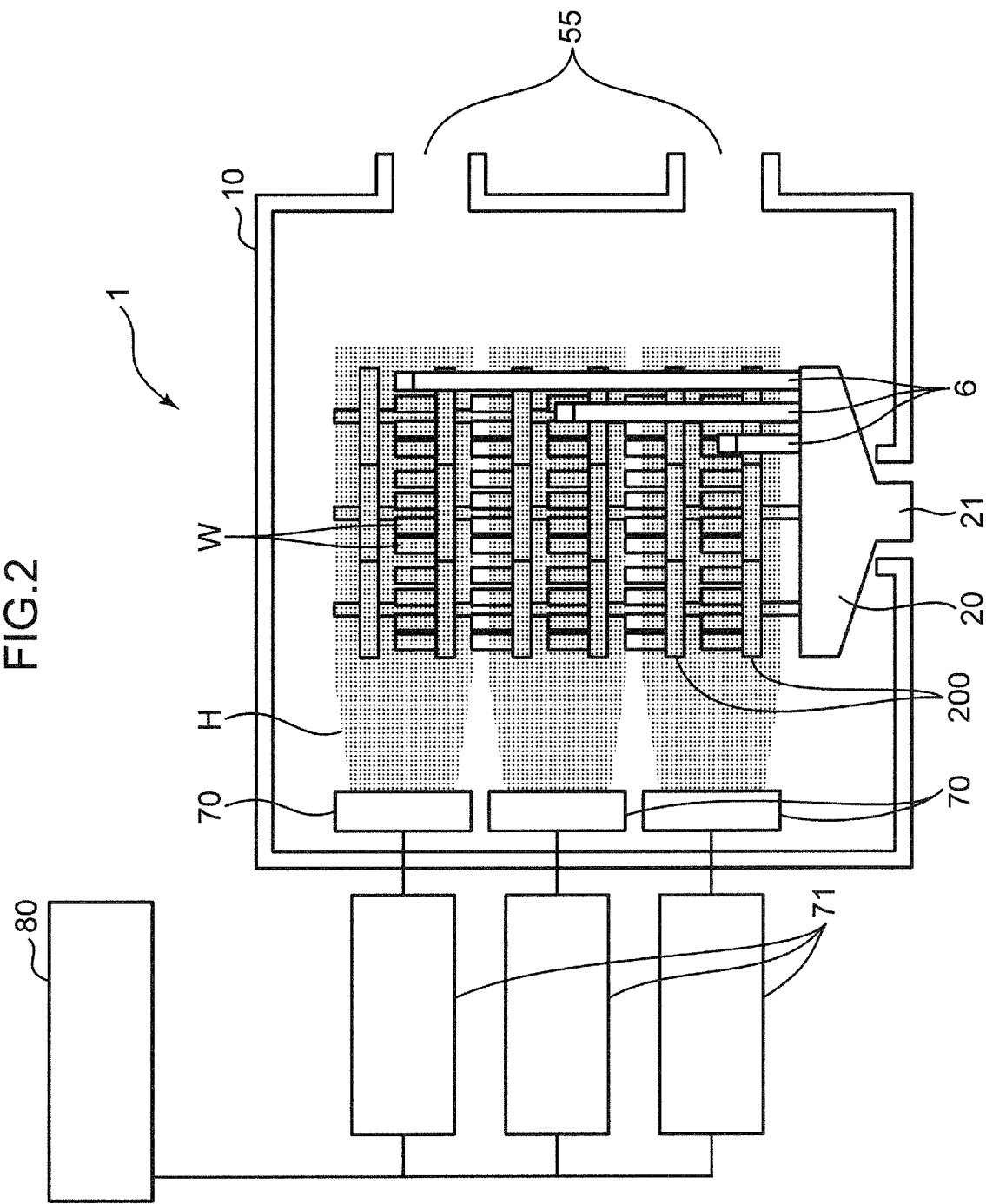
FIG. 2 is a schematic front sectional view of a nitriding apparatus according to an embodiment of the present invention.
Figure 3:
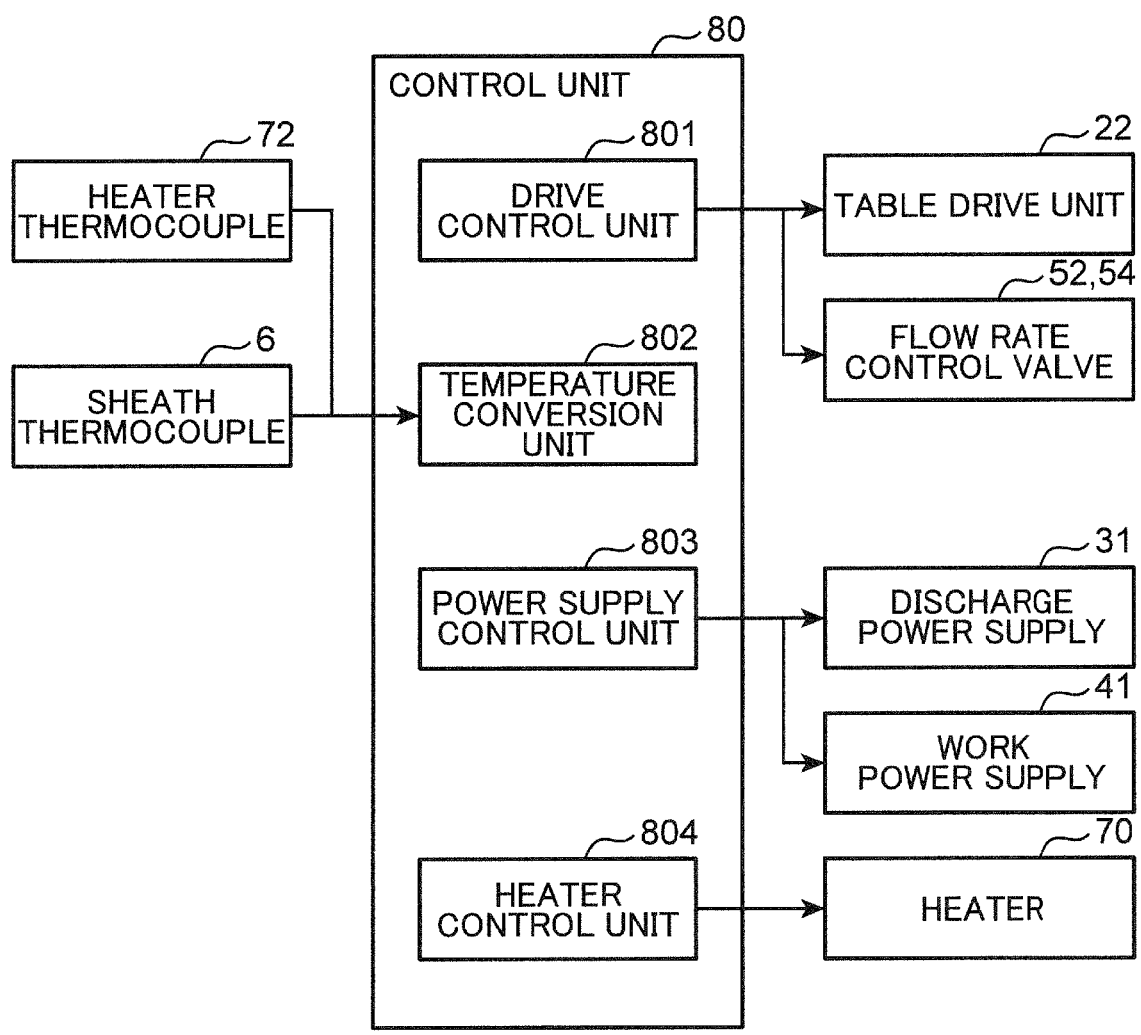
FIG. 3 is a block diagram of a control unit of a nitriding apparatus according to an embodiment of the present invention.
Figure 4:
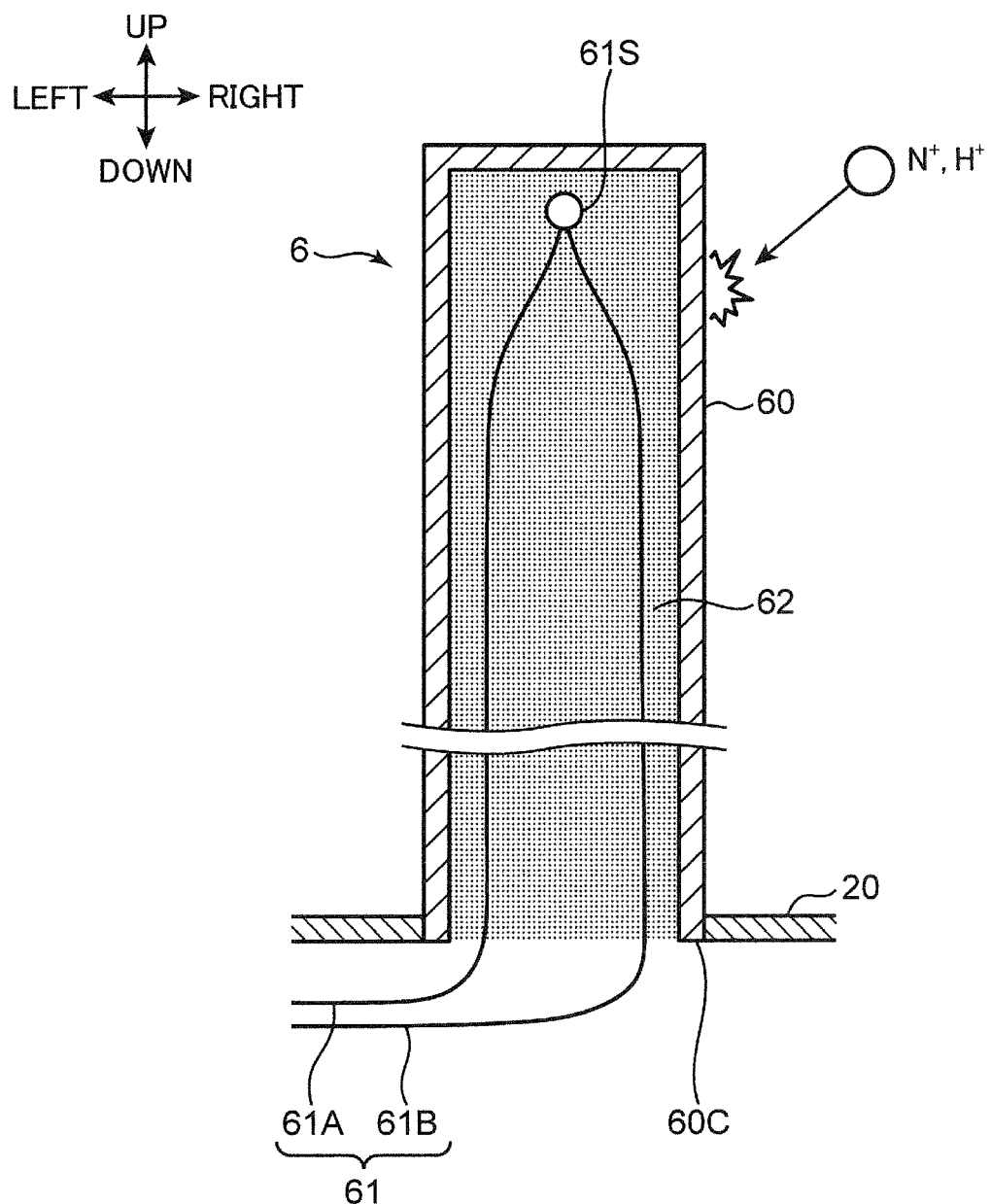
FIG. 4 is a cross-sectional view of a sheath thermocouple of a nitriding apparatus according to an embodiment of the present invention.

Hereinafter, a nitriding apparatus 1 according to an embodiment of the present invention will be described with reference to the drawings. FIG. 1 is a schematic perspective view of the nitriding apparatus 1 according to the present embodiment. FIG. 2 is a schematic front sectional view of the nitriding apparatus 1 according to the present embodiment. FIG. 3 is a block diagram of a control unit 80 of the nitriding apparatus 1 according to the present embodiment. FIG. 4 is a sectional view of a sheath thermocouple 6 of the nitriding apparatus 1 according to the present embodiment.

The nitriding apparatus 1 applies nitriding to a work W (object to be treated). Specifically, the nitriding apparatus 1 is configured such that the work W is placed in an atmosphere in which nitrogen gas is diluted with hydrogen gas, and nitrogen ions and other active species existing in plasma react with the work W to form a hardened layer on a surface of the work W. Examples of the work W include a metal screw, a tool, a mold, and the like. The nitriding apparatus 1 may be configured such that the nitriding is followed by another treatment such as deposition. The nitriding apparatus 1 includes a chamber 10, a rotary table 20 (support), a table support 21, a table drive unit 22, a plasma generator 30 (plasma source), a work application unit 40, and a gas supplying unit 50.

The chamber 10 is a so-called vacuum chamber including an internal space under vacuum (substantial vacuum) caused by using a vacuum device (not illustrated). The chamber 10 is made of a conductive metal material and includes a chamber side wall 35 serving as an electrode.

The rotary table 20 is rotatably disposed in the internal space of the chamber 10. In the present embodiment, the rotary table 20 is made of a conductive metal material. The rotary table 20 has a disk shape and is disposed with its upper surface portion facing upward. As illustrated in FIG. 1, multiple works W is placed on the upper surface portion of the rotary table 20 at predetermined intervals in a rotation direction of the rotary table 20. As a result, the rotary table 20 supports at least one of the works W. Then, the rotary table 20 and the work W are electrically connected to each other. Although in the present embodiment, the work W has a cylindrical shape extending vertically, the shape of the work W is not limited to this.

FIG. 1 illustrates a part of the rotary table 20 in an enlarged manner for description. In the present embodiment, the rotary table 20 includes multiple sub-tables 200 stacked vertically as illustrated in FIG. 2. Then, multiple works W is placed on the respective sub-tables 200. As illustrated in FIG. 2, the multiple sub-tables 200 is disposed in the internal space of the chamber 10 every two stages distributed into three regions of an upper stage, a middle stage, and a lower stage.

The table support 21 (FIGS. 1 and 2) is connected to a lower surface portion of the rotary table 20 by passing through a bottom portion of the chamber 10. In the present embodiment, the table support 21 has a cylindrical shape extending vertically. The table support 21 has a center line aligned with a rotation center of the rotary table 20.

The table drive unit 22 generates a driving force for rotating the table support 21 in an arrow direction in FIG. 1. As the table support 21 rotates, the rotary table 20 and a work W placed on the rotary table 20 rotate in an arrow direction in FIG. 1. When the table drive unit 22 cannot be provided, multiple works W may be placed on a fixed (non-rotating) table instead of the rotary table 20.

The plasma generator 30 generates plasma P in the internal space of the chamber 10. The plasma generator 30 includes a discharge power supply 31 (plasma power supply), a chamber conductive path 32, a filament conductive path 33, a filament 34 (negative pole or cathode), and a chamber side wall 35 (positive pole or anode).

The discharge power supply 31 applies voltage to the filament 34 and the chamber side wall 35 to form a predetermined potential difference between the filament 34 and the chamber side wall 35.

The chamber conductive path 32 electrically connects a positive electrode of the discharge power supply 31 to the chamber side wall 35. The filament conductive path 33 electrically connects a negative electrode of the discharge power supply 31 to the filament 34.

The filament 34 is disposed facing the rotary table 20 (work W) in the internal space of the chamber 10. When a current is allowed to flow into the filament 34, the filament 34 is heated to emit thermoelectrons. In the present embodiment, the filament 34 is a linear member made of tungsten or the like that is disposed extending vertically. The filament 34 extends vertically facing the sub-tables 200 in multiple stages in FIG. 2.

The chamber side wall 35 is composed of a side wall (inner wall) of the chamber 10 and is disposed outside the rotary table 20 while facing the filament 34, as illustrated in FIG. 1. That is, as illustrated in FIG. 1, the rotary table 20, the filament 34, and the chamber side wall 35 are disposed in this order in the internal space of the chamber 10 when viewed from the rotation center of the rotary table 20. The chamber side wall 35 serves as an anode of the plasma generator 30.

When the discharge power supply 31 provides a predetermined potential difference between the filament 34 and the chamber side wall 35 through the filament conductive path 33 and the chamber conductive path 32, plasma is generated in the internal space of the chamber 10. As a result, nitrogen ions $N^+$ and hydrogen ions $H^+$ are respectively generated from nitrogen and hydrogen supplied to the internal space of the chamber 10.

The work application unit 40 applies a predetermined voltage to the rotary table 20, the works W, and a metal sheath 60 described later. The work application unit 40 includes a work power supply 41 (power supply for an object to be treated), a work conductive path 42, and a chamber conductive path 43.

The work power supply 41 applies a predetermined voltage to the works W and the metal sheath 60 so that the works W and the metal sheath 60 described later are set to an identical potential on the negative side. The work conductive path 42 electrically connects a negative electrode of the work power supply 41 to the rotary table 20. The chamber conductive path 43 electrically connects a positive electrode of the work power supply 41 to the chamber 10.

The gas supplying unit 50 communicates with the internal space of the chamber 10 to supply a gas containing at least nitrogen and hydrogen to the internal space. Specifically, the gas supplying unit 50 includes a hydrogen tank 51, a hydrogen flow rate control unit 52, a nitrogen tank 53, a nitrogen flow rate control unit 54, and a gas supply port 55. The hydrogen tank 51 internally contains hydrogen gas in a compressed state. The hydrogen flow rate control unit 52 is disposed between the hydrogen tank 51 and the internal space of the chamber 10. The hydrogen flow rate control unit 52 opens a valve under control of a control unit 80 described later, and adjusts a flow rate of hydrogen gas supplied to the chamber 10 from the hydrogen tank 51. The nitrogen tank 53 internally contains nitrogen gas in a compressed state. The nitrogen flow rate control unit 54 is disposed between the nitrogen tank 53 and the internal space of the chamber 10. The nitrogen flow rate control unit 54 opens a valve under control of the control unit 80 described later, and adjusts a flow rate of nitrogen gas supplied to the chamber 10 from the nitrogen tank 53. The gas supply port 55 is provided in the chamber 10 to allow the hydrogen gas and the nitrogen gas supplied from the hydrogen tank 51 and the nitrogen tank 53, respectively, to flow into the internal space of the chamber 10.

The nitriding apparatus 1 further includes multiple (at least one) sheath thermocouples 6, multiple (at least one) heaters 70, a heater power supply 71, a heater thermocouple 72, and the control unit 80.

As illustrated in FIG. 1, the sheath thermocouple 6 is placed (fixed) on the upper surface portion of the rotary table 20 (sub-table 200, FIG. 2). In particular, the sheath thermocouple 6 is disposed adjacent to one work W of the multiple works W, and more specifically is disposed between two works W adjacent to each other in the rotation direction of the rotary table 20. With reference to FIGS. 1 and 4, the sheath thermocouple 6 includes a metal sheath 60 (accommodating member), a thermocouple wire 61, and an insulating material 62 (insulating layer).

The thermocouple wire 61 is disposed adjacent to at least one work W on the rotary table 20 in the internal space of the chamber 10. The thermocouple wire 61 includes a first wire 61A, a second wire 61B, and a temperature measuring contact 61S (temperature measuring section). The first wire 61A and the second wire 61B are each made of a different metal. The first wire 61A and the second wire 61B are connected at the temperature measuring contact 61S. The temperature measuring contact 61S is located in a leading end portion of the metal sheath 60. The first wire 61A and the second wire 61B have ends opposite to the temperature measuring contact 61S, and the ends are also connected to each other with a lead wire (not illustrated). Thus, the thermocouple wire 61 is based on the known Seebeck effect in which when a closed loop is formed by two different kinds of metal and a temperature difference is applied between opposite joints of the two different kinds of metal, an electromotive force is generated. That is, the thermocouple wire 61 generates the above electromotive force in accordance with temperature detected by the temperature measuring contact 61S, and outputs a signal corresponding to the electromotive force. The signal (temperature information) of temperature at or near the work W measured by the thermocouple wire 61 is input to a temperature conversion unit 802 of the control unit 80.

The insulating material 62 (insulating layer) is filled (disposed) inside a cylinder of the metal sheath 60 to hold the thermocouple wire 61. In the present embodiment, the insulating material 62 is made of a high-purity inorganic insulating material, and holds the thermocouple wire 61 while insulating the thermocouple wire 61 from the metal sheath 60.

The metal sheath 60 internally accommodates the thermocouple wire 61 to cover the temperature measuring contact 61S while being insulated from the thermocouple wire 61. In the present embodiment, the metal sheath 60 has a cylindrical shape, and the cylindrical shape has an upper end portion sealed with an upper surface portion of the metal sheath 60. In contrast, a lower end portion 60C of the cylindrical shape of the metal sheath 60 communicates with (is exposed to) the lower surface portion of the rotary table 20 by passing through the rotary table 20. As an example, the metal sheath 60 is made of stainless steel (SUS316). As illustrated in FIG. 4, when the metal sheath 60 is supported (placed) on the rotary table 20, the metal sheath 60 and the rotary table 20 are electrically connected to each other.

As illustrated in FIG. 2, multiple sheath thermocouples 6 each having the above configuration are disposed above each of the sub-tables 200 to measure temperature in corresponding one of vertically different regions (upper, middle, and lower stages of the internal space). That is, the multiple sheath thermocouples 6 are disposed on the rotary table 20 although they are different from each other in height direction. The multiple sub-tables 200 and the rotary table 20 are electrically connected to each other, so that the rotary table 20, the sub-tables 200, the multiple works W, and the metal sheath 60 of each of the multiple sheath thermocouples 6, which are accommodated in the chamber 10, are all electrically connected to each other.

The heater 70 is disposed in the internal space of the chamber 10 to heat the works W by radiation heating. The heater power supply 71 applies predetermined voltage to the heater 70 to cause the heater 70 to generate heat. The heater power supply 71 is controlled by a heater control unit 804 described later of the control unit 80. The heater thermocouple 72 has a temperature measuring section (temperature measuring contact) disposed in the internal space of the chamber 10 to measure temperature of the heater 70. Information (signal) on temperature of the heater 70 measured by the heater thermocouple 72 is input to the temperature conversion unit 802 of the control unit 80.

As illustrated in FIG. 2, multiple heaters 70 and multiple heater power supplies 71 having the same configurations as described above are vertically disposed adjacent to each other. The multiple heaters 70 are disposed in the internal space of the chamber 10 to heat the corresponding vertically different regions (upper, middle, and lower stages of the internal space). FIG. 2 illustrates heating regions H in which the respective heaters 70 provide radiation heating.

The control unit 80 is composed of a central processing unit (CPU), a read only memory (ROM) for storing a control program, a random access memory (RAM) used as a work area of the CPU, and the like. The control unit 80 is electrically connected to the heater thermocouple 72, the sheath thermocouples 6 (thermocouple wires 61), the table drive unit 22, flow rate control valves (the hydrogen flow rate control unit 52, the nitrogen flow rate control unit 54), the discharge power supply 31, the work power supply 41, and the heaters 70. The control unit 80 functions to have a drive control unit 801, a temperature conversion unit 802, a power supply control unit 803 (treatment condition control unit), and a heater control unit 804 (treatment condition control unit) by causing the CPU to execute a control program stored in the ROM.

The drive control unit 801 causes the table drive unit 22 to rotate the rotary table 20 at a predetermined rotation speed. The drive control unit 801 also causes the hydrogen flow rate control unit 52 and the nitrogen flow rate control unit 54 to respectively supply hydrogen gas and nitrogen gas from the hydrogen tank 51 and the nitrogen tank 53 into the chamber 10 at a predetermined flow rate (pressure).

The temperature conversion unit 802 converts signals received from the heater thermocouple 72 and the sheath thermocouple 6 based on a preset calculation formula, and derives temperature of the heaters 70 and temperature of the works W. Each derived temperatures is displayed on a display unit (not illustrated) provided in the nitriding apparatus 1.

The power supply control unit 803 causes the discharge power supply 31 to apply predetermined voltage between the filament 34 and the chamber side wall 35 to generate plasma P. The power supply control unit 803 also controls the amount of plasma generated by the plasma generator 30 by controlling the discharge power supply 31 based on the signal output from the thermocouple wire 61. The power supply control unit 803 also causes the work power supply 41 to apply predetermined voltage to between the chamber side wall 35 and the rotary table 20. As a result, the power supply control unit 803 sets the rotary table 20 (sub-table 200), the multiple works W, and the multiple metal sheaths 60 of the respective sheath thermocouples 6 to an identical potential (negative potential).

The heater control unit 804 controls the multiple heater power supplies 71 so that the corresponding multiple heaters 70 generate heat. The multiple heater power supplies 71 can be controlled independently, so that heating values of the multiple heaters 70 can be set independently. The heater control unit 804 controls a heating value of a heater 70 based on the signal output from a thermocouple wire 61. At this time, the heater control unit 804 controls a heating value of the heater 70 facing the thermocouple wire 61 among the multiple heaters 70 based on the signals output from the thermocouple wires 61 of the multiple sheath thermocouples 6 disposed at respective vertically different positions in the internal space of the chamber 10.

The nitriding apparatus 1 having the above configuration applies the nitriding to the work W through at least the following steps.

Step (1): The rotary table 20 (sub-table 200) is disposed in the internal space of the chamber 10, and the work W made of metal is supported by the rotary table 20.

Step (2): The thermocouple wire 61 including the temperature measuring contact 61S and outputting a signal corresponding to temperature detected by the temperature measuring contact 61S is disposed adjacent to the work W in the internal space of the chamber 10.

Step (3): The metal sheath 60 made of metal insulated from the thermocouple wire 61 is disposed in the internal space of the chamber 10, and the thermocouple wire 61 is accommodated in the metal sheath 60 such that the temperature measuring contact 61S is covered. The sheath thermocouple 6 is used in the present embodiment as described above, so that the thermocouple wire 61 and the metal sheath 60 are integrated and disposed in the internal space of the chamber 10 (particularly, above the rotary table 20 or the sub table 200).

Step (4): A gas containing at least nitrogen is supplied to the internal space of the chamber 10 under vacuum.

Step (5): The work W is heated by radiation heating using the heater 70 disposed in the internal space of the chamber 10.

Step (6): Nitrogen ions are generated from at least the nitrogen by the plasma generator 30 having the filament 34 (cathode) disposed in the internal space of the chamber 10 and the chamber side wall 35 (anode) disposed facing the filament 34.

Step (7): Predetermined voltage is applied to the work W and the metal sheath 60 by the work application unit 40 to set the work W and the metal sheath 60 to an identical potential on the negative side, and nitriding is applied to the work W by colliding the nitrogen ions with the work W while a heating value of the heater 70 is controlled based on the signal output from the thermocouple wire 61. Application of the voltage using the work application unit 40 may be continuously performed prior to step (6).

As described above, the nitriding apparatus 1 according to the present embodiment and the method of nitriding using the nitriding apparatus 1 include the filament 34 (cathode) and the chamber side wall 35 (anode), which are independent of the work W, without using the work W as an electrode of the plasma generator 30. As a result, the plasma generator 30 can stably generate nitrogen ions to be supplied to the work W. The work W is set to a negative potential together with the metal sheath 60 of the sheath thermocouple 6 by the work application unit 40. Thus, nitrogen ions, which are cations in the plasma P, are attracted toward the work W to collide with the work W. As a result, the nitriding of the work W can be stably performed. Additionally, the work W and the metal sheath 60 of the sheath thermocouple 6 have an identical potential. Thus, as illustrated in FIG. 4, nitrogen ions are attracted toward and collide with the metal sheath 60 of the sheath thermocouple 6 as same as in the work W. Then, the collision of the ions causes surface temperature of each of the work W and the metal sheath 60 to similarly rise. This enables the sheath thermocouple 6 to accurately detect the temperature of the work W equivalent to that of the metal sheath 60 by detecting the temperature of the metal sheath 60 with the thermocouple wire 61. The heater control unit 804 then adjusts the heating value of the heater 70 based on the signal output from the thermocouple wire 61 of the sheath thermocouple 6. This enables the temperature of the work W to be stably set to a suitable temperature for the nitriding. As a result, the temperature of the work W does not rise excessively, and thus formation of a compound layer on the surface of the work W can be suppressed.

As described above, in the present embodiment, the work W and the metal sheath 60 can be placed in a similar environment subject to the collision of cations (nitrogen ions and hydrogen ions), so that a temperature rise similar to a temperature rise of the work W due to collision energy of cations can be also applied to the metal sheath 60 of the sheath thermocouple 6. As a result, the temperature of the work W can be measured accurately by the sheath thermocouple 6 disposed near the work W. In the present embodiment, the work W is independent of the electrodes of the plasma generator 30, and the filament 34 and the chamber side wall 35 of the plasma generator 30 are disposed separately from the work W, so that collision of cations with the work W and that with the metal sheath 60 can be similarly achieved.

In the present embodiment, the power supply control unit 803 controls the discharge power supply 31 based on the signal output from the thermocouple wire 61 to further control the amount of plasma generated by the plasma generator 30. That is, when temperature of the work W detected by the sheath thermocouple 6 exceeds a predetermined range suitable for the nitriding reaction, the power supply control unit 803 causes the discharge power supply 31 to reduce the amount of plasma generated by the plasma generator 30. In this case, the amount of nitrogen ions produced decreases, and the amount of nitrogen ions that collide with the work W and the metal sheath 60 also decreases. As a result, the temperature of the work W can be reduced. On the contrary, when the temperature of the work W is too low, the power supply control unit 803 may cause the discharge power supply 31 to increase the amount of plasma generated by the plasma generator 30.

In the present embodiment, the sheath thermocouple 6 includes the metal sheath 60 and the thermocouple wire 61, so that an operator can easily measure temperature of the work W by attaching the sheath thermocouple 6 to the rotary table 20 (sub-table 200). Thus, work time for preparation of nitriding can be shortened as compared with when the metal sheath 60 and the thermocouple wire 61 are each formed of a different member. The sheath thermocouple 6 integrally includes the insulating material 62 holding the thermocouple wire 61 in advance inside the metal sheath 60. This does not require work for accommodating the thermocouple wire 61 in the metal sheath 60 while the thermocouple wire 61 is insulated from the metal sheath 60 prior to the nitriding due to the metal sheath 60 and the thermocouple wire 61 that are each formed of a different member as described above.

In the present embodiment, the work W and the metal sheath 60 are electrically connected to the rotary table 20 (sub-table 200). Thus, when the work application unit 40 applies voltage to the rotary table 20, the work W and the metal sheath 60 are set to an identical potential. Thus, when the sheath thermocouple 6 is preliminarily fixed (mounted) at a predetermined position on the rotary table 20 (sub-table 200), and the work W is mounted on the upper surface portion of the rotary table 20 (sub-table 200), the sheath thermocouple 6 and the work W can be easily set to an identical potential. Instead of the rotary table 20, a holder (support) (not illustrated) may hold the work W and the sheath thermocouple 6 (metal sheath 60). Even in this case, when the holder is a conductor and the work application unit 40 applies voltage to the holder, the work W and the metal sheath 60 can be set to an identical potential.

In the present embodiment, as illustrated in FIG. 2, multiple works W are placed on the respective sub-tables 200 in the internal space of the chamber 10, and then are vertically disposed at intervals. The multiple heaters 70 are disposed horizontally facing the corresponding multiple works W in the internal space of the chamber 10 to heat the works W. The sheath thermocouple 6 including the metal sheath 60 and the thermocouple wire 61 is disposed adjacent to the corresponding works W. Thus, the multiple heating regions H for the corresponding multiple works W are vertically disposed adjacent to each other. The heater control unit 804 then controls heating values of the multiple heaters 70 based on the signals output from the thermocouple wires 61 of the respective multiple sheath thermocouples 6. Thus, when temperatures of the works W in the lower stage is too low, the heating value of the heater 70 in the lower stage is increased. When temperatures of the works W in the upper stage is too high, the heating value of the heater 70 in the upper stage is reduced. As a result, each heating region H can be controlled independently, so that temperatures of the multiple works W distributed vertically can be stably controlled.

In the present embodiment, the plasma generator 30 includes the filament 34 that emits thermions when a current flows therethrough, the chamber side wall 35 disposed facing the filament 34, and the discharge power supply 31 for applying a voltage to the filament 34 and the chamber side wall 35 to form a predetermined potential difference between the filament 34 and the chamber side wall 35. This enables the plasma P containing nitrogen ions to be stably formed at a position different from that of each of the works W, so that nitrogen ions can be stably supplied to the works W. At this time, the chamber side wall 35 of the chamber 10 is used as an anode of the plasma generator 30, so that the plasma P can be formed without disposing another anode electrode.

In step (4) described above, the gas containing hydrogen in addition to the nitrogen is desirably supplied into the internal space of the chamber 10 under vacuum, and in step (6) described above, the plasma generator 30 desirably further generates hydrogen ions from the hydrogen in addition to the nitrogen ions.

In this case, when an oxide is generated on a surface of a work W, the hydrogen ions existing in the internal space of the chamber 10 reacts with the oxide to generate water ($H_2O$), and thus the oxide can be removed.

In step (7) described above, a voltage of −600 V or more and 0 V or less is desirably applied to the work W and the metal sheath 60 to allow the work W and the metal sheath 60 to be set to an identical potential on the negative side. Further, a voltage of −500 V or more and −300 V or less is preferably and desirably applied.

In the present embodiment, as described above, the plasma generator 30 independent of the work W is provided. That is, the work W that receives supply of nitrogen ions for nitriding and the plasma generator 30 that generates nitrogen ions are electrically independent of each other. This enables plasma P at high density to be formed with a low voltage (bias) as compared with when the work W constitutes a part of an electrode of the plasma generator 30. When a bias to be applied to the work W and the metal sheath 60 is adjusted within the range described above, a potential difference between the work W and the metal sheath 60, and the chamber 10 is adjusted, and thus supply energy of nitrogen ions to the work W can be adjusted. The present embodiment enables nitriding of the work W without always applying a bias to the work W and the metal sheath 60. However, applying the bias as described above enables promoting the supply of nitrogen ions and enhancing reactivity of the nitriding.

In step (4) described above, a gas containing at least nitrogen is desirably supplied to the internal space of the chamber 10 under vacuum to cause pressure in the chamber 10 to be 0.2 Pa or more and 0.5 Pa or less.

Typical ion nitriding technique has conventionally used hydrogen gas and ammonia gas, and the gas under a pressure of about several hundred Pa has been supplied to the chamber 10. In contrast, the present embodiment uses nitrogen gas and hydrogen gas as described above, and does not use ammonia gas. When nitrogen ions are generated from nitrogen gas, a mean free path needs to be increased by reducing gas pressure due to high ionization energy of nitrogen. Thus, when the gas pressure supplied to the chamber 10 is set within the range described above, nitrogen ions can be stably generated from nitrogen.

EXAMPLES

Hereinafter, embodiments of the present invention will be described in more detail with reference to examples, but the present invention is not limited to the following examples. Comparative experiments were conducted under experimental conditions as follows.

<Common Conditions>

Voltage applied to a work W and a metal sheath 60 is −400 V.

Pressure of gas containing nitrogen and hydrogen supplied to a chamber 10 is 0.3 Pa.

EXAMPLE

A dummy hob corresponding to the work W is placed on a rotary table 20, and carbon tool steel (SK5) as a test piece for temperature measurement and a sheath thermocouple 6 are placed and fixed on the rotary table 20, and thus the test piece and a metal sheath 60 of the sheath thermocouple 6 are set to an identical potential. The test piece has a target temperature of 400° C. set by a heater control unit 804. After the test piece (SK5) was subjected to nitriding under the above conditions, tempering temperature of the test piece (SK5) was performed to result in a maximum temperature of 444.3 degrees during the nitriding. In contrast, temperature of the work W obtained from an output signal of the sheath thermocouple 6 including the metal sheath 60 set to the identical potential to the work W was 444.4 degrees. As described above, the temperature of the work W was able to be accurately measured in the aspect of FIG. 2.

COMPARATIVE EXAMPLE

A dummy hob corresponding to the work W is placed on a rotary table 20, and carbon tool steel (SK5) as a test piece for temperature measurement is placed and fixed on the rotary table 20. In the present comparative example, a thermocouple (not illustrated) is disposed in an upper portion of an internal space of the chamber 10. The test piece has a target temperature of 550° C. set by the heater control unit 804. After the test piece (SK5) was subjected to nitriding under the above conditions, tempering temperature of the test piece (SK5) was measured to result in a maximum temperature of 456.0° C. during the nitriding. In contrast, temperature of the work W obtained from an output signal of the thermocouple was 315.8° C. As described above, the measurement error of the temperature of the work W increases in the comparative example as compared with the example.

Although the nitriding apparatus 1 according to the embodiment of the present invention and the method of nitriding using the nitriding apparatus 1 have been described above, the present invention is not limited to these embodiments, and the following modified embodiments are possible.

(1) The plasma generator 30 is described in the above embodiment in which the filament 34 constitutes a cathode, the chamber side wall 35 of the chamber 10 constitutes an anode, and plasma P is generated between the filament 34 and the chamber side wall 35 to produce nitrogen ions from nitrogen gas. However, the present invention is not limited to this. The plasma generator 30 may use a known hollow cathode, arc discharge, sputtering, microwave, high frequency inductively coupled plasma (ICP), parallel plate electrode, or the like.

Figure 5:
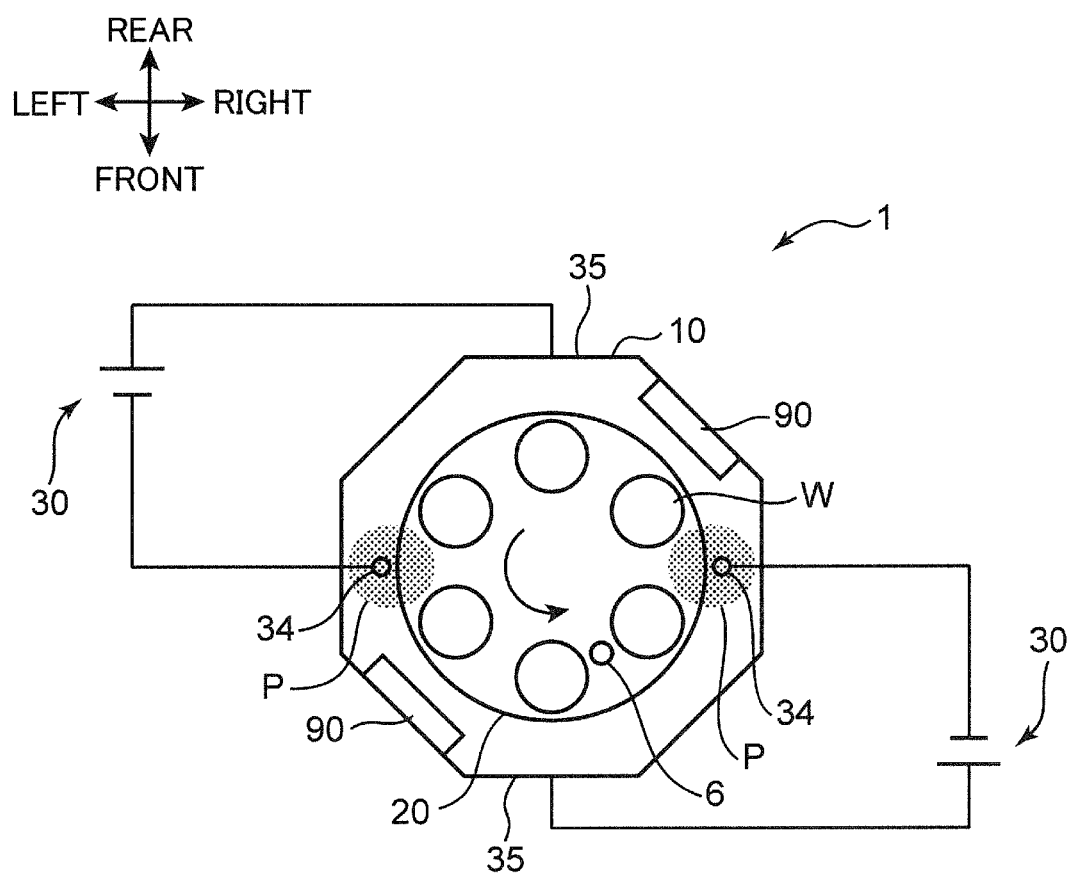
FIG. 5 is a plan view of a nitriding apparatus according to a first modified embodiment of the present invention.

(2) FIG. 5 is a plan view of the nitriding apparatus 1 according to a first modified embodiment of the present invention. In the present modified embodiment, the nitriding apparatus 1 includes multiple evaporation sources 90 as compared with the previous embodiment. The plasma generator 30 generates plasma P between the filament 34 and the chamber side wall 35 of the chamber 10 as in the previous embodiment. Multiple works W and sheath thermocouples 6 are supported on the upper surface portion of the rotary table 20 rotating. As in the previous embodiment, the works W and the sheath thermocouples 6 are set to an identical potential through the rotary table 20. Even in such a configuration, the plasma generator 30 is independent of the works W, so that the plasma P at high density can be generated around the filament 34. Thus, when the works W passes near the filament 34 as the rotary table 20 rotates, nitrogen ions diffuse inside the works W. As a result, the nitriding on the works W can be increased in speed. The sheath thermocouple 6 is set to the identical potential to that of the work W and is subjected to collision of cations, so that temperatures of the works W can be measured accurately.

(3) FIG. 6 is a plan view of the nitriding apparatus 1 according to a second modified embodiment of the present invention. In the present modified embodiment, the nitriding apparatus 1 includes multiple evaporation sources 90 (arc evaporation sources) as compared with the previous embodiment. In the present modification embodiment, the evaporation sources 90 each constitute an anode of the plasma generator 30. Thus, the plasma generator 30 generates plasma P between the filament 34 and the corresponding one of the evaporation sources 90. Multiple works W and sheath thermocouples 6 are supported on the upper surface portion of the rotary table 20 rotating. As in the previous embodiment, the works W and the sheath thermocouples 6 are set to an identical potential through the rotary table 20. In such a configuration, the plasma P generated by the plasma generator 30 is distributed over a wide range of the internal space of the chamber 10. Thus, a diffusion reaction occurs in the works W in the wide range of the internal space during rotation of the rotary table 20. This allows the diffusion reaction of nitriding to the works W to penetrate deep into the works W. As a result, nitriding causing a higher strength is achieved. The nitriding apparatus 1 of FIG. 6 may include multiple evaporation sources 90 divided into multiple regions in a vertical direction (a direction orthogonal to the paper surface). In this case, voltage applied to the evaporation sources 90 in the respective regions can be set individually, so that density of the plasma P in a height direction (vertical direction) of the chamber 10 can be controlled. Even in this case, the plasma generator 30 is independent of the work W, so that the plasma P at high density can be generated. As a result, the nitriding on the works W can be increased in speed. The sheath thermocouple 6 is set to the identical potential to that of the work W and is subjected to collision of cations, so that temperatures of the works W can be measured accurately.

(4) The number of each of the works W, the sheath thermocouples 6, the heaters 70, and the like in the above embodiment is not limited to the aspects illustrated in FIGS. 1 and 2, and at least one work W, at least one sheath thermocouple 6, and at least one heater 70 may be provided. The metal sheath 60 and the thermocouple wire 61 are not limited to those integrated as the sheath thermocouple 6. A metal pipe or the like accommodating the thermocouple wire 61 may be disposed in the internal space of the chamber 10 and set to an identical potential to that of the work W. In this case, an end of the metal pipe is desirably sealed to cover the temperature measuring contact 61S.

The present invention provides a nitriding apparatus, the nitriding apparatus including: a chamber made of metal having an internal space; a gas supplying unit communicating with the internal space to supply a gas containing at least nitrogen to the internal space; a support disposed in the internal space to support at least one object to be treated that is made of metal; a plasma source that generates plasma in the internal space, and has a cathode disposed in the internal space and an anode disposed facing the cathode to generate nitrogen ions from at least the nitrogen; at least one heater disposed in the internal space to heat the object to be treated; at least one thermocouple wire that is disposed in the internal space, being adjacent to the at least one object to be treated and having a temperature measuring section to output a signal corresponding to temperature detected by the temperature measuring section; at least one accommodating member made of metal that internally accommodates the at least one thermocouple wire to cover the temperature measuring section in a state insulated from the at least one thermocouple wire; a power supply for an object to be treated that applies predetermined voltage to the at least one object to be treated and the at least one accommodating member to set the at least one object to be treated and the at least one accommodating member to an identical potential on a negative side; and a treatment condition control unit that controls a heating value of the at least one heater based on the signal output from the at least one thermocouple wire.

According to the present configuration, a plasma source independent of an object to be treated is provided without using the object to be treated as an electrode of the plasma source. As a result, the plasma source can stably generate nitrogen ions to be supplied to the object to be treated. The object to be treated is set to a potential on the negative side together with the accommodating member by the power supply for an object to be treated. Thus, the nitrogen ions, which are cations in the plasma, are attracted toward the object to be treated to collide with the object. As a result, the nitriding of the object to be treated can be stably performed. The object to be treated and the accommodating member are set to the identical potential. Thus, the nitrogen ions are attracted toward the accommodating member to collide with the accommodating member similarly to the object to be treated. Then, surface temperatures of the object to be treated and the accommodating member similarly rise due to the collision of the ions. This enables accurate detection of temperature of the object to be treated, equivalent to that of the accommodating member, by detecting temperature of the accommodating member with the thermocouple wire. The treatment condition control unit then adjusts the heating value of the heater based on the signal output from the thermocouple wire. This enables the temperature of the object to be treated to be stably set to a suitable temperature for the nitriding. As a result, the temperature of the object to be treated does not rise excessively, and thus formation of a compound layer on the surface of the object to be treated can be suppressed.

In particular, in the above configuration, the object to be treated and the accommodating member can be placed in a similar environment subject to collision of cations (nitrogen ions), so that a temperature rise similar to a temperature rise of the object to be treated due to collision energy of cations can be also applied to the accommodating member. As a result, the temperature of the object to be treated can be measured accurately by the thermocouple wire disposed near the object to be treated. In the above configuration, the object to be treated is independent of the electrode of the plasma source, and the electrode of the plasma source is disposed separately from the object to be treated, and thus enabling cations to collide with the object to be treated and the accommodating member in a similar manner.

The above configuration desirably further includes at least one sheath thermocouple including the at least one thermocouple wire and the at least one accommodating member, the at least one sheath thermocouple further including an insulating layer that is disposed inside the accommodating member and holds the at least one thermocouple wire.

According to the present configuration, the sheath thermocouple includes the accommodating member and the thermocouple wire, so that an operator can easily measure temperature of the object to be treated by attaching the sheath thermocouple to the support. Thus, work time for preparation of nitriding can be shortened as compared with when the accommodating member and the thermocouple wire are formed of different members independent of each other. The sheath thermocouple integrally includes the insulating layer that preliminarily holds the thermocouple wire inside the accommodating member. This does not require work for accommodating the thermocouple wire in the accommodating member while the thermocouple wire is insulated from the accommodating member prior to the nitriding due to the accommodating member and the thermocouple wire that are each formed of a different member as described above.

The above configuration is desirably configured such that the support is formed of a conductive member, the at least one object to be treated and the at least one accommodating member are supported by the support to be electrically connected to the support, and the power supply for being treated applies the voltage to the support to set the at least one object to be treated and the at least one accommodating member to an identical potential.

According to the present configuration, applying voltage to the support using the power supply for being treated enables the object to be treated and the accommodating member to be easily set to the identical potential.

The above configuration is desirably configured such that the support is a rotary table having an upper surface portion and being rotatable about an axis extending vertically, and the at least one object to be treated and the at least one accommodating member are placed on the upper surface portion of the rotary table to be electrically connected to the rotary table.

According to the present configuration, placing the thermocouple wire and an object to be supported on the upper surface portion of the rotary table enables the thermocouple wire and the object to be supported to be easily set to the identical potential.

The above configuration is desirably configured such that the gas supplying unit supplies a gas further containing hydrogen to the internal space, and the plasma source further generates hydrogen ions from the hydrogen.

According to the present configuration, hydrogen ions exist in the internal space of the chamber. Thus, when an oxide is formed on the surface of the object to be treated, hydrogen ions react with the oxide to generate water ($H_2O$), and thus the oxide can be removed.

The above configuration is desirably configured such that the plasma source further includes a power supply for plasma that applies voltage to the cathode and the anode to form a predetermined potential difference between the cathode and the anode.

The present configuration enables plasma containing nitrogen ions to be stably formed at a position different from that of each of the object to be treated, so that nitrogen ions can be stably supplied to the object to be treated.

The above configuration may be configured such that the anode is composed of an inner wall of the chamber. The above configuration may further include an evaporation source disposed in the internal space to allow the support to be interposed between the cathode and the evaporation source, wherein the anode is composed of the evaporation source.

The above configuration is desirably configured such that the at least one object to be treated includes multiple objects to be treated that are disposed apart from each other in a predetermined direction in the internal space, the at least one heater includes multiple heaters that are disposed facing the corresponding multiple objects to be treated in the internal space to heat the corresponding multiple objects to be treated, the at least one thermocouple wire and the at least one accommodating member include multiple thermocouple wires and multiple accommodating members, respectively, being disposed adjacent to the corresponding multiple objects to be treated, and the treatment condition control unit controls a heating value of each of the multiple heaters based on the signal output from the corresponding one of the multiple thermocouple wires.

The present configuration enables heating regions of the respective multiple heaters distributed in a predetermined direction to be independently controlled, so that temperatures of the multiple objects to be treated distributed in the direction above can be stably controlled.

The above configuration is desirably configured such that the treatment condition control unit further controls the amount of plasma generated by the plasma source based on the signal output from the at least one thermocouple wire.

According to the present configuration, when temperature of the object to be treated detected by the thermocouple wire exceeds a predetermined range suitable for the nitriding reaction, the treatment condition control unit can reduce the amount of plasma generated by the plasma source. In this case, the amount of nitrogen ions produced decreases, and the amount of nitrogen ions that collides with the object to be treated and the accommodating member also decreases. As a result, the temperature of the object to be treated can be reduced. On the contrary, when the temperature of the object to be treated is too low, the temperature of the object to be treated can be raised by increasing the amount of plasma generated by the plasma source under control of the treatment condition control unit.

The present invention also provides a method of nitriding, the method of nitriding including the steps of: disposing a support in an internal space of a chamber and supporting an object to be treated that is made of metal with the support; disposing a thermocouple wire in the internal space to be adjacent to the object to be treated, the thermocouple wire including a temperature measuring section and outputting a signal corresponding to temperature detected by the temperature measuring section; disposing an accommodating member made of metal and insulated from the thermocouple wire in the internal space, and accommodating the thermocouple wire in the accommodating member to cover the temperature measuring section; supplying a gas containing at least nitrogen into the internal space of the chamber under vacuum; heating the object to be treated with a heater disposed in the internal space; generating plasma in the internal space using a plasma source that is disposed in the internal space and has a cathode and an anode disposed facing the cathode to generate nitrogen ions from at least the nitrogen; and applying nitriding to the object to be treated by applying predetermined voltage to the object to be treated and the accommodating member to set the object to be treated and the accommodating member to an identical potential on a negative side, and by colliding the nitrogen ions with the object to be treated while controlling a heating value of the heater based on the signal output from the thermocouple wire.

According to the present method, the object to be treated is set to a potential on the negative side together with the accommodating member by the power supply for an object to be treated. Thus, the nitrogen ions, which are cations in the plasma, are attracted toward the object to be treated to collide with the object. As a result, the nitriding of the object to be treated can be stably performed. The object to be treated and the accommodating member are set to the identical potential. Thus, the nitrogen ions are attracted toward the accommodating member to collide with the accommodating member similarly to the object to be treated.

Then, surface temperatures of the object to be treated and the accommodating member similarly rise due to the collision of the ions. This enables accurate detection of temperature of the object to be treated, equivalent to that of the accommodating member, by detecting temperature of the accommodating member with the thermocouple wire. Then, the heating value of the heater is adjusted based on the signal output from the thermocouple wire. This enables the temperature of the object to be treated to be stably set to a suitable temperature for the nitriding. As a result, the temperature of the object to be treated does not rise excessively, and thus formation of a compound layer on the surface of the object to be treated can be suppressed.

The above method is desirably configured such that the gas containing hydrogen in addition to the nitrogen is supplied into the internal space of the chamber under vacuum, and the plasma source further generates hydrogen ions from the hydrogen in addition to the nitrogen ions.

According to the present method, hydrogen ions exist in the internal space of the chamber. Thus, when an oxide is formed on the surface of the object to be treated, hydrogen ions react with the oxide to generate water ($H_2O$), and thus the oxide can be removed.

The above method is desirably configured such that a voltage of −600 V or more and 0 V or less is applied to the object to be treated and the accommodating member to allow the object to be treated and the accommodating member to be set to an identical potential on the negative side.

According to the present method, the plasma source independent of the object to be treated generates plasma. That is, the object to be treated that receives supply of nitrogen ions for nitriding and the plasma source that generates nitrogen ions are electrically independent of each other. This enables plasma at high density to be formed with a low voltage (bias) as compared with when the object to be treated constitutes a part of an electrode of the plasma source.

The above method is desirably configured such that the gas containing at least nitrogen is supplied to the internal space of the chamber under vacuum to cause pressure in the chamber to be 0.2 Pa or more and 0.5 Pa or less.

According to the present method, even when a large amount of energy is required as ionization energy of nitrogen to generate nitrogen ions from nitrogen gas, gas pressure supplied to the chamber is set low, and thus a mean free path of ions increases to enable nitrogen ions to be stably generated from nitrogen.

The invention claimed is:
1. A nitriding apparatus comprising:
 a chamber made of metal having an internal space;
 a gas supplying unit communicating with the internal space to supply a gas containing at least nitrogen to the internal space;
 a support disposed in the internal space to support at least one object to be treated that is made of metal;
 a plasma source that generates plasma in the internal space, and has a cathode disposed in the internal space and an anode disposed facing the cathode to generate nitrogen ions from at least the nitrogen;
 at least one heater disposed in the internal space to heat the object to be treated;
 at least one thermocouple wire that is disposed in the internal space, being adjacent to the at least one object to be treated and having a temperature measuring section to output a signal corresponding to temperature detected by the temperature measuring section;

at least one accommodating member made of metal that internally accommodates the at least one thermocouple wire to cover the temperature measuring section in a state insulated from the at least one thermocouple wire;
a power supply for an object to be treated that applies predetermined voltage to the at least one object to be treated and the at least one accommodating member to set the at least one object to be treated and the at least one accommodating member to an identical potential on a negative side; and
a treatment condition control unit that controls a heating value of the at least one heater based on the signal output from the at least one thermocouple wire,
the support is formed of a conductive member, and
the at least one object to be treated and the at least one accommodating member are supported by the support to be electrically connected to the support.

2. The nitriding apparatus according to claim 1, further comprising
at least one sheath thermocouple including the at least one thermocouple wire and the at least one accommodating member,
the at least one sheath thermocouple further including an insulating layer that is disposed inside the accommodating member and holds the at least one thermocouple wire.

3. The nitriding apparatus according to claim 1, wherein the power supply for being treated applies the voltage to the support to set the at least one object to be treated and the at least one accommodating member to an identical potential.

4. The nitriding apparatus according to claim 3, wherein the support is a rotary table having an upper surface portion and being rotatable about an axis extending vertically, and
the at least one object to be treated and the at least one accommodating member are placed on the upper surface portion of the rotary table to be electrically connected to the rotary table.

5. The nitriding apparatus according to claim 1, wherein the gas supplying unit supplies a gas further containing hydrogen to the internal space, and
the plasma source further generates hydrogen ions from the hydrogen.

6. The nitriding apparatus according to claim 1, wherein the plasma source further includes a power supply for plasma that applies voltage to the cathode and the anode to form a predetermined potential difference between the cathode and the anode.

7. The nitriding apparatus according to claim 6, wherein the anode is composed of an inner wall of the chamber.

8. The nitriding apparatus according to claim 1, wherein
the at least one object to be treated includes multiple objects to be treated that are disposed apart from each other in a predetermined direction in the internal space,
the at least one heater includes multiple heaters that are disposed facing the corresponding multiple objects to be treated in the internal space to heat the corresponding multiple objects to be treated,
the at least one thermocouple wire and the at least one accommodating member include multiple thermocouple wires and multiple accommodating members, respectively, being disposed adjacent to the corresponding multiple objects to be treated, and
the treatment condition control unit controls a heating value of each of the multiple heaters based on the signal output from the corresponding one of the multiple thermocouple wires.

9. The nitriding apparatus according to claim 1, wherein the treatment condition control unit further controls the amount of plasma generated by the plasma source based on the signal output from the at least one thermocouple wire.

10. A nitriding apparatus comprising
a chamber made of metal having an internal space;
a gas supplying unit communicating with the internal space to supply a gas containing at least nitrogen to the internal space;
a support disposed in the internal space to support at least one object to be treated that is made of metal;
a plasma source that generates plasma in the internal space, and has a cathode disposed in the internal space and an anode disposed facing the cathode to generate nitrogen ions from at least the nitrogen;
at least one heater disposed in the internal space to heat the object to be treated;
at least one thermocouple wire that is disposed in the internal space, being adjacent to the at least one object to be treated and having a temperature measuring section to output a signal corresponding to temperature detected by the temperature measuring section;
at least one accommodating member made of metal that internally accommodates the at least one thermocouple wire to cover the temperature measuring section in a state insulated from the at least one thermocouple wire;
a power supply for an object to be treated that applies predetermined voltage to the at least one object to be treated and the at least one accommodating member to set the at least one object to be treated and the at least one accommodating member to an identical potential on a negative side;
a treatment condition control unit that controls a heating value of the at least one heater based on the signal output from the at least one thermocouple wire, and
an evaporation source disposed in the internal space,
wherein the anode is composed of the evaporation source.

11. The nitriding apparatus according to claim 10, wherein
the evaporation source allows the support to be interposed between the cathode and the evaporation source.

12. A method of nitriding, comprising the steps of:
disposing a support in an internal space of a chamber and supporting an object to be treated that is made of metal with the support;
disposing a thermocouple wire in the internal space to be adjacent to the object to be treated, the thermocouple wire including a temperature measuring section and outputting a signal corresponding to temperature detected by the temperature measuring section;
disposing an accommodating member made of metal and insulated from the thermocouple wire in the internal space, and accommodating the thermocouple wire in the accommodating member to cover the temperature measuring section;
supplying a gas containing at least nitrogen into the internal space of the chamber under vacuum;
heating the object to be treated with a heater disposed in the internal space;
generating plasma in the internal space using a plasma source that is disposed in the internal space and has a cathode and an anode disposed facing the cathode to generate nitrogen ions from at least the nitrogen; and
applying nitriding to the object to be treated by applying predetermined voltage to the object to be treated and the accommodating member to set the object to be treated and the accommodating member to an identical potential on a negative side, and by colliding the nitrogen ions with the object to be treated while controlling a heating value of the heater based on the signal output from the thermocouple wire, wherein, the support is formed of a conductive member, and the object to be treated and the accommodating member are supported by the support to be electrically connected to the support.

13. The method of nitriding according to claim 12, wherein the gas containing hydrogen in addition to the nitrogen is supplied into the internal space of the chamber under vacuum, and the plasma source further generates hydrogen ions from the hydrogen in addition to the nitrogen ions.

14. The method of nitriding according to claim 12, wherein a voltage of −600 V or more and 0 V or less is applied to the object to be treated and the accommodating member to allow the object to be treated and the accommodating member to be set to an identical potential on the negative side.

15. The method of nitriding according to claim 12, wherein the gas containing at least nitrogen is supplied to the internal space of the chamber under vacuum to cause pressure in the chamber to be 0.2 Pa or more and 0.5 Pa or less.

* * * * *